United States Patent [19]

Buck

[11] 3,932,774

[45] Jan. 13, 1976

[54] ELECTRONIC MONITORING SYSTEM WITH SHORT-CIRCUIT PROTECTION

[76] Inventor: Robert Buck, Kirchbuhlweg 128, Neukirch, Germany

[22] Filed: June 24, 1974

[21] Appl. No.: 482,478

[30] Foreign Application Priority Data
June 22, 1973  Germany.............................. 2331732

[52] U.S. Cl............. 307/308; 307/202; 307/252 W; 328/5; 331/65; 340/258 B; 340/258 C
[51] Int. Cl.²...................... H01H 36/00; G08B 13/26; H03K 17/08; H03K 17/72
[58] Field of Search ........................... 307/116–119, 307/202, 252 W, 308; 317/DIG. 2, 146; 328/5; 331/65; 340/258 B, 258 C

[56] References Cited
UNITED STATES PATENTS

| | | | |
|---|---|---|---|
| 3,281,638 | 10/1966 | Crawford ....................... | 307/252 W |
| 3,601,621 | 8/1971 | Ritchie.............................. | 331/65 X |
| 3,648,076 | 3/1972 | Lester ........................ | 340/258 C X |
| 3,747,010 | 7/1973 | Buck................................. | 328/5 X |
| 3,747,011 | 7/1973 | Buck................................. | 328/5 X |
| 3,747,012 | 7/1973 | Buck................................. | 328/5 X |

*Primary Examiner*—Stanley D. Miller, Jr.
*Assistant Examiner*—L. N. Anagnos
*Attorney, Agent, or Firm*—Karl F. Ross; Herbert Dubno

[57] ABSTRACT

A contactless motion detector, including an oscillator and an amplifier, has an energizing circuit connected across a Zener diode in a section of a voltage divider also comprising a current-sensing resistor, another section of this divider comprising an output thyristor in parallel with a resistive branch which may be a constant-current unit. The voltage divider receives pulsating direct current from a supply circuit including a load; an ancillary thyristor has its gate and cathode connected across the current-sensing resistor so as to fire when the load current exceeds a certain limit, the two thyristors being so coupled to each other that conduction of the ancillary thyristor cuts off the output thyristor. Normally, the output thyristor is controlled by a switching transistor responding to an output signal from the motion detector; the ancillary thyristor, when conducting, may directly lower the gate potential of the output thyristor or may remove normal operating potential from a deactivating input of the detector to disable a switching transistor which controls the output thyristor in response to an output signal from the detector.

10 Claims, 4 Drawing Figures

ELECTRONIC MONITORING SYSTEM WITH SHORT-CIRCUIT PROTECTION

CROSS-REFERENCE TO RELATED APPLICATIONS

This application contains subject matter disclosed in my copending applications Ser. No. 325,953, filed 22, January 1973 as a continuation-in-part of application Ser. No. 290,866 (now U.S. Pat. No. 3,747,010), and Ser. No. 478,682, filed 12 June 1974.

FIELD OF THE INVENTION

My present invention relates to an electronic monitoring system, e.g., as used in a proximity sensor, incorporating a preferably contactless detector sensitive to an ambient condition for generating an output signal which varies with a change in that condition, e.g., with the approach of a metallic element.

BACKGROUND OF THE INVENTION

In my copending applications identified above, as well as in my prior U.S. Pat Nos. 3,747,010, 3,747,011 and 3,747,012, I have disclosed a system of this type wherein a contactless motion detector includes an oscillator and an amplifier connected to a load via a two-wire circuit which serves both for the actuation of that load and for the energization of the oscillator and amplifier. An output thyristor, triggerable by a detector-controlled switching transistor, is connected across all or part of a voltage-generating network that includes an electronic breakdown device, specifically a Zener diode, in series with a high-ohmic resistor which is short-circuited upon the firing of the thyristor (either in the absence or in the presence of the object whose approach is to be monitored), the voltage drop across the Zener diode insuring the availability of a sufficient operating voltage for the detector in either state of conductivity of the thyristor. My copending applications also teach the inclusion in the voltage-generating network of a storage capacitor connected in parallel with the breakdown device and separated therefrom by a decoupling diode, this capacitor serving to smooth the ripples of the raw-rectified supply voltage which insures prompt cutoff of the thyristor upon de-energization of its gate.

It has already been proposed (see German published specification No. 2,149,063) to protect a system of this general type against overloads or short circuits by inserting a current-sensing resistor in series with the output thyristor, this resistor being shunted by a charging capacitor connected to it through a diode. The charging capacitor lies in the emitter-base circuit of a transistor whose emitter-collector circuit is connected across the gate-cathode path of the output thyristor. When the sensing resistor is traversed by an abnormally high current, the voltage drop thereacross turns on the transistor and shorts the thyristor gate to its cathode. However, the short-circuiting transistor conducts only for a limited period determined by the time constant of an R/C circuit which includes the charging capacitor and the transistor base. As the base current of the saturated transistor is substantial, the capacitor eventually discharges since the monitoring current-sensing resistor — and therefore the voltage drop across it — must be relatively small in order to avoid untimely conduction. After the transistor has been cut off, the output thyristor can fire on the next half-cycle of the supply voltage even if the overload condition still exists. Thus, the short-circuit protection afforded by such circuitry is of limited duration.

OBJECT OF THE INVENTION

It is, therefore, the object of my present invention to provide lasting overload and short-circuit protection in a system of the character set forth.

SUMMARY OF THE INVENTION

This object is realized, pursuant to my present invention, by the use of a bistable electronic switch such as an ancillary thyristor as a device for stopping the current flow through an output thyristor, or other semiconductive variable-impedance device, on being triggered by excessive current flow through a current-sensing resistor, this resistor forming part of a voltage divider connected across the supply of raw-rectified voltage. The voltage divider comprises a first impedance network, which includes the output thyristor or other semiconductive device, and a second impedance network of which the current-sensing resistor forms a part. The power-input terminals of the oscillator and its amplifier, or some other detector sensitive to an ambient condition, are connected across at least part of the second impedance network which preferably includes a Zener diode in series with the monitoring resistor; thus, the power supply for the detector may be taken either from across the zener diode alone or from across the entire second impedance network.

In order to supply the Zener diode in the second impedance network with the necessary operating current when the output thyristor is cut off, this thyristor is advantageously shunted by a resistive branch which may comprise a constant-current unit designed to stabilize the operating voltage for the detector in the face of widely varying input voltages, as more fully described in my prior application Ser. No. 478,682.

The semiconductive device to be protected against overloads and short circuits, in accordance with my present invention, need not be a binary electronic switch such as a thyristor or a triac; it could also be a variable-impedance device (e.g., a transistor) responsive to an analog signal, with a conductivity changing gradually over a predetermined range. Instead of an oscillator, therefore, the detector may include other sensing means such as a magnetic diode, a field plate, a photoresistor, a photodiode, a phototransistor, a resistive or reactive bridge circuit, or the like.

BRIEF DESCRIPTION OF THE DRAWING

The above and other features of my present invention will now be described in detail with reference to the accompanying drawing in which.

SPECIFIC DESCRIPTION

Figure 1:
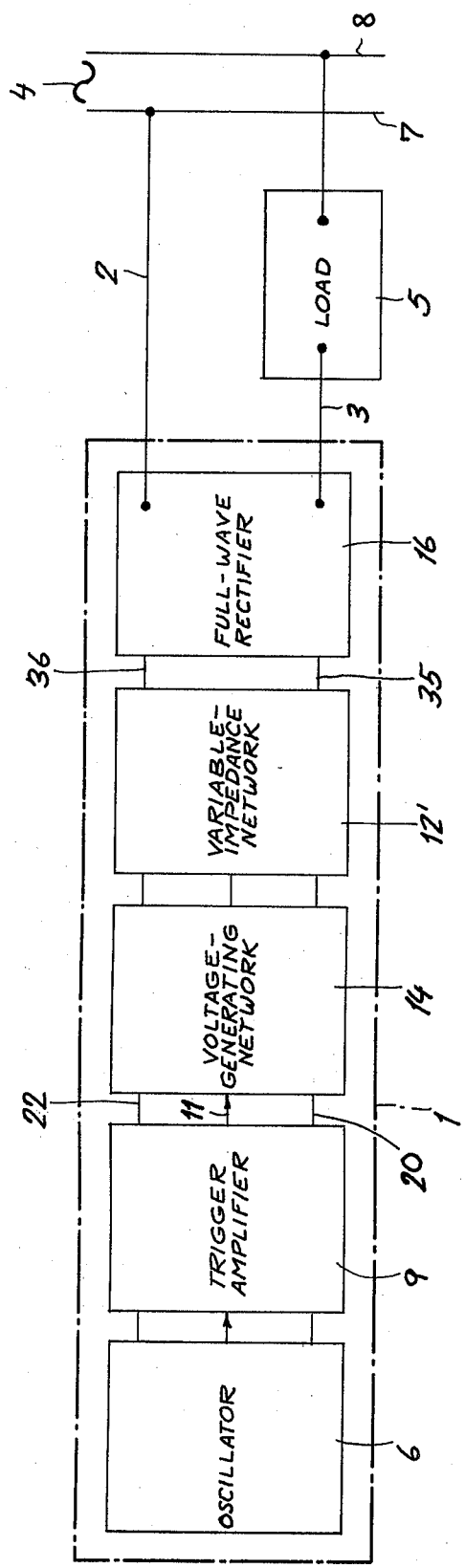
FIG. 1 is a block diagram of an electronic monitoring system embodying my invention.

FIG. 1 shows the basic components of a monitoring system according to my invention, namely an oscillator 6 and a trigger amplifier 9 together constituting a detector, a current-responsive load 5 such as a relay in a supply circuit whose two conductors 2, 3 are connected via respective bus bars 7, 8 across an a-c source 4, a full-wave rectifier 16 inserted between the supply conductors 2, 3 and a pair of leads 35, 36 extending to a variable-impedance network 12' whose impedance controls the load current in response to signals from oscillator 6, and a voltage-generating network 14 also receiving the output of rectifier 16 by way of leads 35 and 36. Network 14 is connected to amplifier 9 by leads 20, 11 and 22 which serve on the one hand to control a field-effect transistor 40 (FIG. 2) within that network and on the other hand to supply the detector stages 6 and 9 with operating voltage. Components 6, 9, 12', 14 and 16 form part of a proximity sensor 1 of the general type described in my prior U.S. Pat. Nos. 3,747,010, 3,747,011 and 3,747,012.

Figure 2:
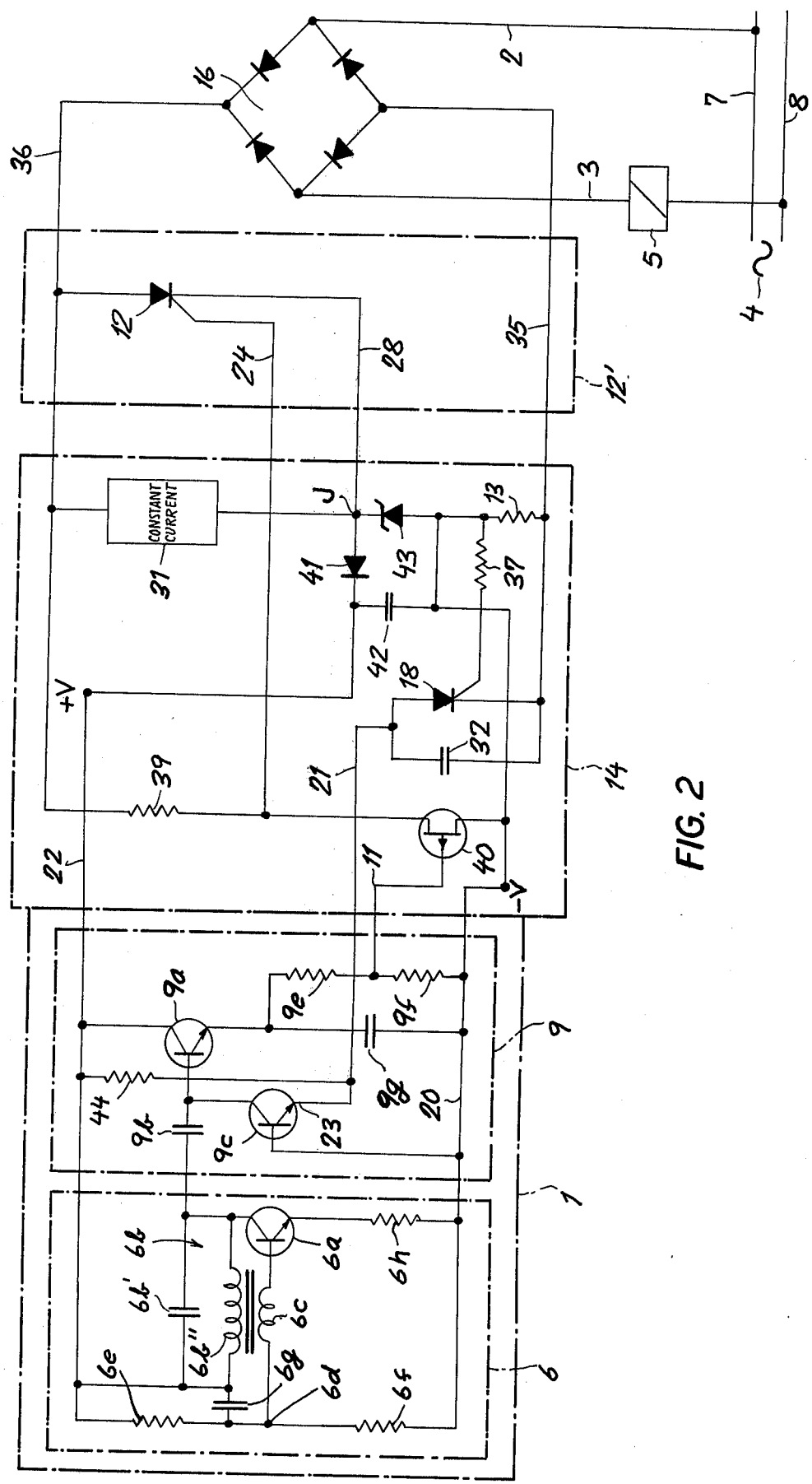
FIG. 2 is an overall circuit diagram of a proximity sensor similar to that shown in my copending applications referred to but illustrating the present improvement.

As shown in FIG. 2, the oscillator 6 comprises an NPN transistor 6a whose collector circuit includes a parallel-resonant network 6b consisting of a capacitor 6b' and an inductor 6b''. A feedback inductor 6c is connected between the base of the transistor 6a and a common terminal 6d of a pair of resistances 6e, 6f forming a voltage-divider network; the two coils 6b'', 6c are inductively coupled as diagrammatically indicated in the drawing. Resistance 6e is bridged by a shunt capacitor 6g. A resistance 6h is connected between the emitter of transistor 6a and negative bus bar 20 also tied to the resistance 6f. This oscillator generates an output of a frequency determined by the tank circuit 6b and at a level depending, in a manner known per se, on the damping induced by the proximity of metal parts to the oscillator (specifically to its tank circuit 6b) which lowers the Q of circuit 6b and therefore reduces the effective collector resistance of transistor 6a along with the amplification factor K so as to attenuate the oscillator output.

Component 9 is an amplification stage triggerable by the output of the oscillator 6 when the loop gain KV of the amplifier 6a thereof makes the transition between values greater and less than unity. The trigger stage 9 comprises a transistor 9a of the NPN type whose base is tied to the collector of transistor 6a by a d.c.-blocking coupling capacitor 9b. The base of transistor 9a is biased postively in the nonconductive state of a transistor 9c whose base is connected to the negative bus bar 20 of the circuit. The output of transistor 9a, whose amplitude decreases upon the approach of a metallic element as described above, is applied by an emitter impedance, in the form of an R/C network consisting of resistors 9e and 9f bridged by a storage capacitor 9g, via lead 11 to the base of the aforementioned field-effect transistor 40 included in the voltage-generating network 37. Transistor 40 has its source tied to negative bus bar 20 and has its drain connected through a resistor 39 to the positive bus bar 36 energized by rectifier bridge 16 with raw-rectified voltage; this drain, in the embodiment of FIG. 2, is further connected to a gate lead 24 of an output thyristor 12 forming part of the variable-impedance network 12'. This output thyristor, whose anode is connected to positive bus bar 36, further has a cathode lead 29 connected through a decoupling diode 41 to the lead 22 which extends to the positive power-input terminal +V of detector 6, 9 whose negative power-input terminal −V is tied to bus bar 20. A storage capacitor 42, serving to smooth the pulsating half-cycles of the raw-rectified voltage from bridge 16, is connected across conductors 20 and 22 in parallel with the series combination of rectifying diode 41 and a Zener diode 43; the junction J of these two diodes is connected through a constant-current unit 31 to positive bus bar 36 which is thus shunted by the anode/cathode path of thyristor 12.

As long as oscillator 6 operates normally, which in this instance may be the case whenever there is no extraneous metallic element in its vicinity, FET 40 is cut off so that its collector/emitter resistance is high compared with the resistance of Zener diode 43 in its conductive state. Gate lead 24 is then positively biased with reference to cathode lead 28 so that thyristor 12 fires periodically. The resulting current, supplementing that which is generated by unit 31, passes through rectifier bridge 16 and relay 5 which controls a nonillustrated position indicator for the monitored element. When that element comes close to the detector oscillator 6, the latter is disabled and de-energizes the gate lead of FET 40 which conducts and drives the lead 24 negative with reference to cathode lead 28, blocking the thyristor 12. The reduced current now drawn through bridge 16 and load circuit 2, 3, limited by the internal circuits of unit 31, releases the relay 5 to indicate the approach of the monitored element. The voltage drop across Zener diode 43, however, is not materially affected by this change in conductivity of binary switch 12 so that an operating voltage for detector 6, 9 remains available at terminals +V and −V.

In accordance with an important feature of my present invention, a current-sensing resistor 13 is connected in series with Zener diode 43 between junction J and the negative input lead 35. This resistor 13 is bridged, through a further resistor 37, across the gate and the anode of an ancillary thyristor 18 which cuts off the current flow through output thyristor 12 when the voltage drop across current-sensing resistor 13 is high enough to fire the thyristor 18. This thyristor is shunted by a storage capacitor 32 designed to prevent its extinction between half-cycles of the raw-rectified supply voltage.

In the embodiment of FIG. 2, thyristor 18 has an anode lead 21 extending to the emitter 23 of transistor 9c which normally is biased positive from bus bar 22 through a high-ohmic resistor 44. When the thyristor 18 breaks down, transistor 9c conducts and turns off the transistor 9a whereby the gate of FET 40 is driven negative and the transistor connects the gate lead 24 to negative bus bar 20, thereby effectively short-circuiting the gate and cathode of output thyristor 12. Emitter 23 of transistor 9c may thus be regarded as a deactivating terminal for the proximity sensor 1.

Constant-current unit 31 may have the construction described in my copending application Ser. No. 478,682 filed June 12, 1974.

Figure 3:
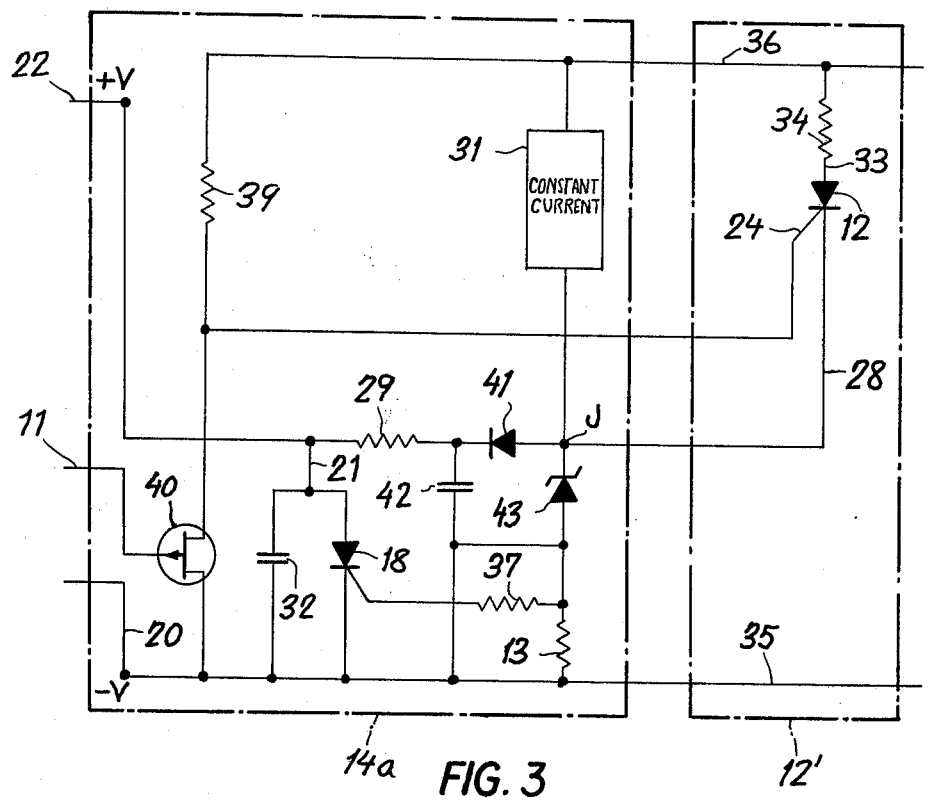
FIGS. 3 and 4 are circuit diagrams of different modifications of a network for the detector stage of the system of FIGS. 1 and 2 provided with protective circuitry according to the present invention.

Whereas in FIG. 2 the negative and positive supply conductors 20, 22 (and therefore the associated terminals +V and −V) are connected only across the Zener diode 43, I have shown in FIG. 3 a modified voltage-generating network 14a wherein the power for the detector is taken from across the series combination of current-sensing resistor 13 and Zener diode 43. In this network, therefore, negative supply terminal −V is common to conductors 20 and 35 whereas positive supply terminal +V is common to conductor 22 and anode lead 21 of thyristor 18. Through a resistor 29 the anode lead 21 is connected to the cathode lead 28 of thyristor 12, the two thyristors being thus connected in series between bus bars 35 and 36.

When resistor 13 senses an overload and fires the thyristor 18, positive bus bar 22 is virtually grounded so that transistor 9a (FIG. 2) cannot conduct. This again closes the electronic switch represented by FET 40, with negative voltage applied to gate lead 24 of thyristor 12 to deactivate the latter. Anode lead 33 of thyristor 12 is here shown to include a current-limiting resistor 32 which of course could also be used in other embodiments.

Figure 4:
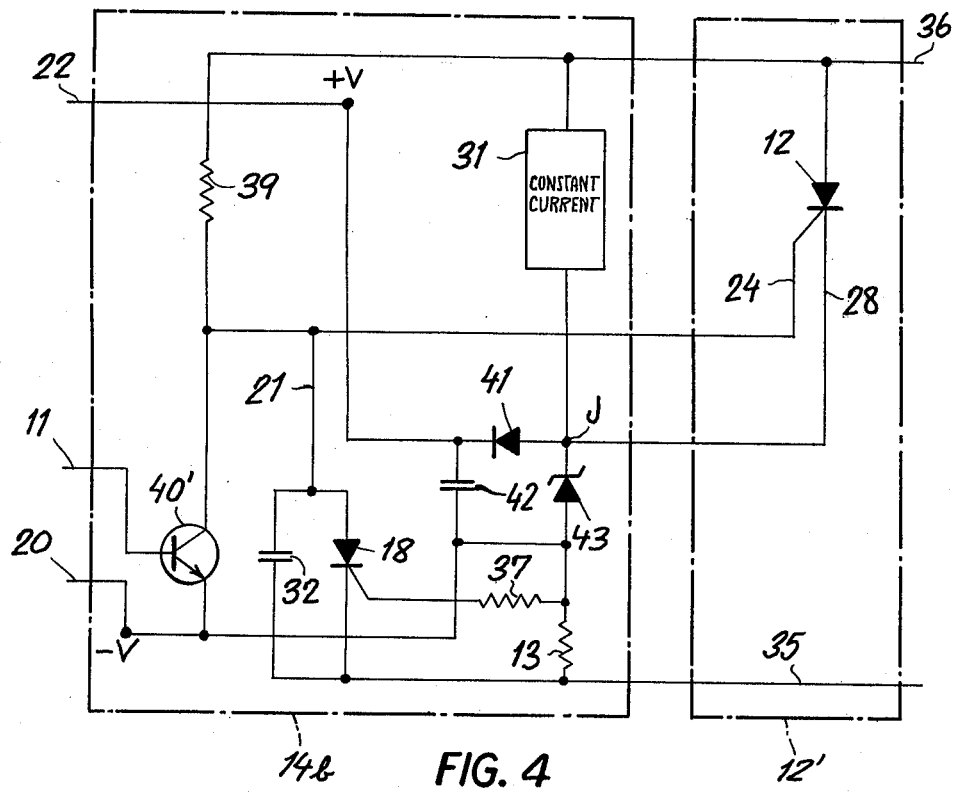

FIG. 4 shows a voltage-generating network 14b which is generally similar to network 14 of FIG. 2, except that the field-effect transistor 40 has been replaced by an NPN transistor 40' whose collector is tied to the gate lead 24 of thyristor 12 as well as to resistor 39. The anode lead 21 of thyristor 18 is also connected to the gate lead 24 so as to cut off the output thyristor 12 in the presence of an excessive voltage drop across sensing resistor 13, regardless of the condition of switching transistor 40'.

The operation of the system of FIG. 4 differs from that of FIGS. 2 and 3 in that the thyristor 12 fires when lead 11 goes negative, i.e., when the oscillator 6 is deactivated by the proximity of an object to be detected.

The use of a constant-current unit 31, while advantageous for the reasons noted above, is not essential for the operation of my improved overload-protection circuit as herein disclosed. Thus, unit 31 could be replaced by a simple resistor where reasonably constant supply voltages are available.

In all the disclosed embodiments the conductive state of the ancillary thyristor 18 is terminated when the supply voltage is cut off, as by the opening of a master swtich in series with the load 5. If the overload or short-circuit condition is removed when power is reapplied, the system will operate normally.

I claim:

1. An electronic monitoring system comprising:
   detector means sensitive to an ambient condition for generating an output signal varying with a change in said condition, said detector means being provided with a pair of power-input terminals;
   a voltage divider consisting of a first impedance network and a second impedance network in series, said first impedance network including a voltage-controlled semiconductive device in parallel with a resistive branch, said second impedance network including a current-sensing resistor, said power-input terminals being connected across at least part of said second impedance network;
   a supply circuit including a source of direct current connected across said voltage divider;
   electronic control means coupled to said detector means and connected to said semiconductive device for altering the conductivity thereof in response to changes in said ambient condition, thereby modifying said output signal with maintenance of a sufficient voltage drop across said second impedance network to keep said detector means operative regardless of changes in the conductivity of said semiconductive device; and
   a bistable electronic switch operatively coupled to said first impedance network and provided with a trigger circuit connected across said current-sensing resistor for open-circuiting said semiconductive device in response to a current flow through said second impedance network exceeding a predetermined limit.

2. A system as defined in claim 1 wherein said semiconductive device is a first thyristor and said electronic switch is a second thyristor.

3. A system as defined in claim 2 wherein said source comprises an alternating-current supply and rectifier means in series therewith for delivering a pulsating direct current to said voltage divider, conduction of said second thyristor preventing energization of said first thyristor by said pulsating direct current.

4. A system as defined in claim 3 wherein said second impedance network includes a Zener diode in series with said current-sensing resistor, a storage capacitor in shunt with said Zener diode, and a decoupling diode inserted between said storage capacitor and a junction of said Zener diode with said first impedance network.

5. A system as defined in claim 4 wherein said second thyristor has an anode and a cathode connected between said power-input terminals.

6. A system as defined in claim 5, further comprising a series resistor inserted between said anode and said decoupling diode.

7. A system as defined in claim 3 wherein said detector is provided with a deactivating input for said control means, said second thyristor having an anode connected to said deactivating input.

8. A system as defined in claim 3 wherein said second thyristor has an anode connected to a gate of said first thyristor.

9. A system as defined in claim 3 wherein said resistive branch includes a constant-current unit.

10. A system as defined in claim 3, further comprising a shunt capacitor connected across said second thyristor.

* * * * *